(12) United States Patent  
Harasaki

(10) Patent No.: US 10,479,613 B2  
(45) Date of Patent: Nov. 19, 2019

(54) TRANSPORT SYSTEM AND TRANSPORT METHOD

(71) Applicant: MURATA MACHINERY, LTD., Kyoto-shi, Kyoto (JP)

(72) Inventor: Kazumi Harasaki, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 64 days.

(21) Appl. No.: 15/776,796

(22) PCT Filed: Oct. 13, 2016

(86) PCT No.: PCT/JP2016/080411  
§ 371 (c)(1),  
(2) Date: May 17, 2018

(87) PCT Pub. No.: WO2017/090334  
PCT Pub. Date: Jun. 1, 2017

(65) Prior Publication Data  
US 2018/0370735 A1 Dec. 27, 2018

(30) Foreign Application Priority Data

Nov. 27, 2015 (JP) .................................. 2015-231832

(51) Int. Cl.  
*B65G 1/04* (2006.01)  
*H01L 21/677* (2006.01)  
(Continued)

(52) U.S. Cl.  
CPC ........... *B65G 43/10* (2013.01); *B65G 1/0457* (2013.01); *G05D 1/02* (2013.01); *H01L 21/6773* (2013.01);  
(Continued)

(58) Field of Classification Search  
CPC .......................... B65G 1/0457; H01L 21/6773  
See application file for complete search history.

(56) References Cited

U.S. PATENT DOCUMENTS

| 5,434,490 A * | 7/1995 | Ishida ................... B61L 23/005 318/587 |
| 2004/0122570 A1* | 6/2004 | Sonoyama ........... G05D 1/0297 701/23 |

(Continued)

FOREIGN PATENT DOCUMENTS

| JP | 2006-313409 A | 11/2006 |
| JP | 2010-066965 A | 3/2010 |

(Continued)

OTHER PUBLICATIONS

English translation of Official Communication issued in International Patent Application No. PCT/JP2016/080411, dated May 31, 2018.

(Continued)

*Primary Examiner* — Thomas Randazzo  
(74) *Attorney, Agent, or Firm* — Keating & Bennett, LLP

(57) ABSTRACT

A transport system includes a track, overhead transport vehicles, and a controller. The controller provides a traveling command to travel to a destination point, to a first overhead transport vehicle that is able to receive a transport command to acquire a FOUP from a station and that is less than a first distance from the station. When a second of the overhead transport vehicles that is able to receive the transport command and is less than the first distance from the station, is detected before providing the transport command to the overhead first transport vehicle, the controller provides the traveling command to the second overhead transport vehicle. Then, the controller provides the transport com- (Continued)

mand to the one of the first and second overhead transport vehicles that first passes through the destination point.

12 Claims, 13 Drawing Sheets

(51) Int. Cl.
    *G05D 1/02*     (2006.01)
    *B65G 43/10*     (2006.01)
    *H01L 21/67*     (2006.01)
    *B65G 35/06*     (2006.01)

(52) U.S. Cl.
    CPC .. *H01L 21/67265* (2013.01); *H01L 21/67706* (2013.01); *H01L 21/67724* (2013.01); *H01L 21/67733* (2013.01); *B65G 35/06* (2013.01)

(56) References Cited

U.S. PATENT DOCUMENTS

| | | | |
|---|---|---|---|
| 2009/0063052 A1* | 3/2009 | Onishi | G05D 1/0265 701/301 |
| 2010/0228389 A1* | 9/2010 | Hayashi | G05D 1/0297 700/229 |
| 2012/0305364 A1* | 12/2012 | Morimoto | H01L 21/67727 198/370.01 |
| 2017/0283182 A1* | 10/2017 | Maejima | G05D 1/0289 |

FOREIGN PATENT DOCUMENTS

| | | | | |
|---|---|---|---|---|
| JP | 2010066965 A | * | 3/2010 | G05D 1/02 |
| JP | 5309814 B2 | | 10/2013 | |

OTHER PUBLICATIONS

Official Communication issued in International Patent Application No. PCT/JP2016/080411, dated Jan. 17, 2017.

* cited by examiner

TRANSPORT SYSTEM AND TRANSPORT METHOD

BACKGROUND OF THE INVENTION

1. Field of the Invention

The present invention relates to a transport system and a transport method.

2. Description of the Related Art

As a transport system to be applied to, for example, a semiconductor manufacturing plant, a known transport system includes a track, a plurality of transport vehicles that travel along the track and convey a transported object to at least a station, and a controller that performs communication with the respective transport vehicles and controls the behavior of the respective transport vehicles (for example, see Japanese Patent No. 5309814).

In the above-described transport system, when a grip-load request to acquire the transported object from the station is present, the controller provides a transport command corresponding to the grip-load request to the transport vehicle. In terms of improving the conveying efficiency of transported objects to the station, when another transport vehicle that is able to receive the transport command and that arrives at the station earlier than the transport vehicle to which the transport command has been provided is newly detected, the controller may perform command swap processing in which the transport command is newly provided to the newly detected transport vehicle after transmitting a delete command to delete the transport command to the transport vehicle to which the transport command has been provided earlier.

In the command swap processing, however, the transport vehicle to which the transport command has been provided earlier may be unable to receive the delete command. Also, even when the transport vehicle transmitted to the controller a response that the delete command has been received, the controller may be unable to receive the response. In such a case, the controller is unable to determine whether the transport command is in a state of being provided to the transport vehicle to which the transport command has been provided earlier, and unable to provide the transport command to the transport vehicle that arrives first at the station.

SUMMARY OF THE INVENTION

Preferred embodiments of the present invention provide transport systems and transport methods each capable of providing a transport command to an appropriate transport vehicle that first arrives at a station.

A transport system according to a preferred embodiment of the present invention includes a track; a plurality of transport vehicles that travel along the track and convey a transported object to at least a station; and a controller configured or programmed to perform communication with and control behavior of respective transport vehicles of the plurality of transport vehicles; wherein in a case that a grip-load request to acquire the transported object from the station is present, the controller is configured or programmed to: detect that a first transport vehicle of the plurality of transport vehicles is able to receive a transport command corresponding to the grip-load request and is located less than a first distance from the station, and provide to the first transport vehicle a traveling command to travel to a destination point located between the station and an upstream side of the station; detect that a second transport vehicle of the plurality of transport vehicles is able to receive the transport command and is located less than the first distance from the station before providing the transport command, and provide the traveling command to the second transport vehicle; and provide the transport command to one of the first transport vehicle and the second transport vehicle that first passes through the destination point.

In this transport system, when a grip-load request to acquire the transported object from the station is present, a traveling command to travel to the destination point is provided, in a duplicate manner, to a plurality of transport vehicles that are able to receive the transport command corresponding to the grip-load request and are less than the first distance from the station. Then, the transport command is provided to the transport vehicle to which the traveling command has been provided and that first passes through the destination point. Accordingly, it is possible to provide the transport command to the transport vehicle that is more appropriate according to the distance to the station. Thus, it is possible to provide the transport command to the appropriate transport vehicle that first arrives at the station.

In a transport system according to a preferred embodiment of the present invention, the destination point may be a point at which one of the transport vehicles that changes to become able to receive the transport command does not newly emerge between the location and the station.

In a transport system according to a preferred embodiment of the present invention, the destination point may be, among junctions of the track on the upstream side of the station, the junction that is the closest to the station. In this case, because the order of the transport vehicles is not switched up to the station after passing through such a junction, it is possible to provide the transport command to the most appropriate transport vehicle.

In a transport system according to a preferred embodiment of the present invention, the controller is configured or programmed to provide the traveling command to one of the first transport vehicle and the second transport vehicle that is closest to the station, and transmit a delete command to one of the first transport vehicle and the second transport vehicle that is not closest to the station to delete the traveling command. In this case, it is possible to reduce or prevent unnecessary traveling of the transport vehicles to which the transport command is not provided.

In a transport system according to a preferred embodiment of the present invention, the controller is configured or programmed to monitor states of the first transport vehicle and the second transport vehicle, and transmit a delete command to one of the first transport vehicle and the second transport vehicle that satisfies a deletion condition to delete the traveling command. In this case, it is possible to reduce or prevent unnecessary traveling of the transport vehicle to which the transport command is not provided.

In a transport system according to a preferred embodiment of the present invention, one of the first transport vehicle and the second transport vehicle transmits a just-before-arrival report to the controller upon reaching a just-before-arrival point that is at a second distance from the destination point; and the controller provides the transport command to the one of the first transport vehicle and the second transport vehicle that transmitted the just-before-arrival report. In this case, it is possible to appropriately provide the transport command to the transport vehicle.

In a transport system according to a preferred embodiment of the present invention, the destination point is, among junctions of the track on the upstream side of the station, the junction that is the closest to the station; the one of the first transport vehicle and the second transport vehicle to which the traveling command has been provided transmits to the controller, from an upstream side of the destination point, a passage permission request to request a permission to pass through the destination point; the controller, upon receiving the passage permission request, transmits a passage permission to the one of the first transport vehicle and the second transport vehicle that transmitted the passage permission request when the one of the first transport vehicle and the second transport vehicle that transmitted the passage permission request is able to pass through the destination point; and the one of the first transport vehicle and the second transport vehicle that transmitted the passage permission request transmits the just-before-arrival report to the controller upon reaching the just-before-arrival point. In this case, when the control to adjust an order of the plurality of transport vehicles that pass through the junction is performed, it is possible to provide the transport command with a high priority to the transport vehicle that first passes through the junction, for example.

In a transport system according to a preferred embodiment of the present invention, in a case where the traveling command has been provided to only one of the plurality of transport vehicles, the controller provides the transport command to at least one of the plurality of transport vehicles other than the only one of the plurality of transport vehicles when the just-before-arrival report is not received from the only one of the plurality of transport vehicles despite reaching the just-before-arrival point. In this case, even when it is not possible to correctly perform communication between the transport vehicle and the controller, it is possible to continue the transport processing.

A transport method according to a preferred embodiment of the present invention is a transport method executed in a transport system including a track, a plurality of transport vehicles that travel along the track and convey a transported object to at least a station, and a controller configured or programmed to perform communication with and control behavior of respective transport vehicles of the plurality of transport vehicles, the transport method including determining that a grip-load request to acquire the transported object from the station is present; causing the controller to detect that a first transport vehicle of the plurality of transport vehicles is able to receive a transport command corresponding to the grip-load request and is located less than a first distance from the station, and provide to the first transport vehicle a traveling command to travel to a destination point located between the station and an upstream side of the station; causing the controller to detect that a second transport vehicle of the plurality of transport vehicles is able to receive the transport command and is located less than the first distance from the station before providing the transport command, and provide the traveling command to the second transport vehicle; and causing the controller to provide the transport command to one of the first transport vehicle and the second transport vehicle that first passes through the destination point.

According to this transport method, as with the above-described transport system, it is possible to provide the transport command to the appropriate transport vehicle that first arrives at the station.

According to preferred embodiments of the present invention, it is possible to provide a transport command to an appropriate transport vehicle that first arrives at a station.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes in detail exemplary preferred embodiments of the present invention with reference to the accompanying drawings. In the respective drawings, for portions that are identical or equivalent, identical reference signs are used and redundant explanations are omitted.

First Preferred Embodiment

Figure 1:
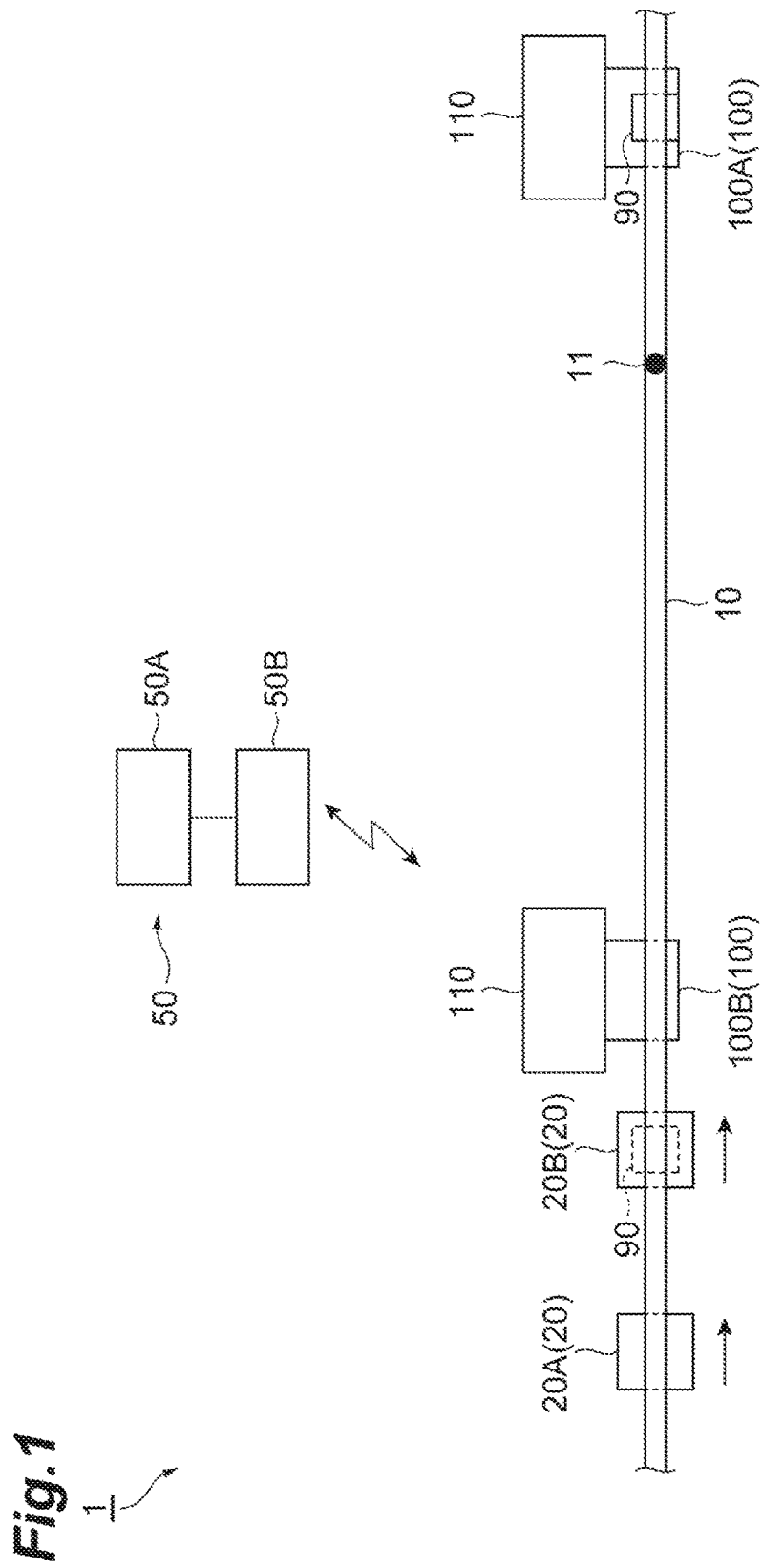
FIG. 1 is a plan view of a portion of a transport system according to a first preferred embodiment of the present invention.

As illustrated in FIG. 1, a transport system 1 includes a track 10, overhead transport vehicles (transport vehicles) 20, and a controller 50. The track 10 preferably is provided at or near the ceiling of a semiconductor manufacturing plant that includes semiconductor processing apparatuses 110. The overhead transport vehicle 20 preferably is an overhead hoist transfer (OHT) and travels in one direction along the track 10 in a state of being suspended from the track 10, for example. The overhead transport vehicle 20 conveys as a transported object a front-opening unified pod (FOUP) 90 in which a plurality of semiconductor wafers are accommodated, for example. The controller 50 performs communication with each of the overhead transport vehicles 20 and controls the behavior of the respective overhead transport vehicles 20.

Below the track 10, a plurality of stations 100 are arranged. The station 100 is a device port provided in the semiconductor processing apparatus 110, for example. When the FOUP is placed on the station 100, the semiconductor wafers accommodated in the FOUP 90 are taken into the semiconductor processing apparatus 110. The semiconductor wafers are then accommodated in the FOUP 90 again after being subjected to certain processing in the semiconductor processing apparatus 110. In FIG. 1, as the stations 100, stations 100A and 100B arranged in the foregoing order from the downstream side of the track 10 are illustrated.

The overhead transport vehicle 20 includes a transfer mechanism that transfers the FOUP 90 with respect to the station 100. The transfer mechanism preferably includes a gripper that grips the FOUP 90 and an elevator that elevates the gripper. Accordingly, by stopping at a location where the FOUP 90 is transferred with respect to the station 100 and activating the transfer mechanism in that state, the overhead transport vehicle 20 is able to transfer the FOUP 90 with respect to the station 100. The transferring the FOUP 90 with respect to the station 100 includes a case where the FOUP 90 that is held (loaded) by the overhead transport vehicle 20 is supplied (unloaded) to the station 100 and a case where the overhead transport vehicle 20 acquires (grips) the FOUP 90 that is placed on the station 100.

The controller 50 is configured or programmed to include a transport controller 50A and a transport vehicle controller 50B. The transport controller 50A is an upper controller with respect to the transport vehicle controller 50B. The transport controller 50A performs communication with the transport vehicle controller 50B and a manufacturing controller (not depicted). The transport vehicle controller 50B performs communication with the transport controller 50A and each of the overhead transport vehicles 20. The manufacturing controller performs communication with each of the semiconductor processing apparatuses 110 and outputs to the transport controller 50A a grip-load request to acquire the FOUP 90 from the station 100 of the respective semiconductor processing apparatuses 110. When the transport controller 50A determines that the grip-load request is provided, the transport vehicle controller 50B provides a transport command corresponding to the grip-load request to any of the overhead transport vehicles 20.

In the transport system 1 of the first preferred embodiment, transport processing described below is performed. As an example, first transport processing performed in the following situation will be described. That is, as illustrated in FIG. 1, the FOUP 90 to be acquired by the overhead transport vehicle 20 is placed on the station 100A arranged below the track 10.

In such a situation, the transport controller 50A determines that the grip-load request to acquire the FOUP 90 from the station 100A is present.

The transport vehicle controller 50B detects an overhead transport vehicle 20A as the overhead transport vehicle 20 to which the transport command corresponding to the grip-load request is able to be provided and that is located less than a first distance from the station 100A. The transport vehicle controller 50B then provides to the overhead transport vehicle 20A a traveling command to travel to a destination point 11 (the first step). The traveling command is different from the transport command described in more detail below.

In the example shown in FIG. 1, on the upstream side of the station 100B and the downstream side of the overhead transport vehicle 20A, there is an overhead transport vehicle 20B that is conveying the FOUP 90 to be unloaded to the station 100B.

The overhead transport vehicle 20 to which the transport command is able to be provided is, for example, an overhead transport vehicle 20 to which the traveling command or the transport command to acquire the FOUP 90 from another station 100 has not been provided (that is, a free carriage). The first distance is a predetermined distance.

The destination point 11 is a location on the upstream side of the station 100A and is a point at which the transport vehicle 20 that changes to become able to receive the transport command does not newly emerge between the location and the station. Even when the overhead transport vehicle 20 that is a free carriage is present between the destination point 11 and the station 100A, the transport vehicle controller 50B does not detect the overhead transport vehicle 20 between the destination point 11 and the station 100A as a new overhead transport vehicle 20 that the transport command is able to be provided to, as will be described in more detail below. In FIG. 1, the destination point 11 is set on the upstream side of the station 100A of the track 10 and on the downstream side of the station 100B.

Figure 2:
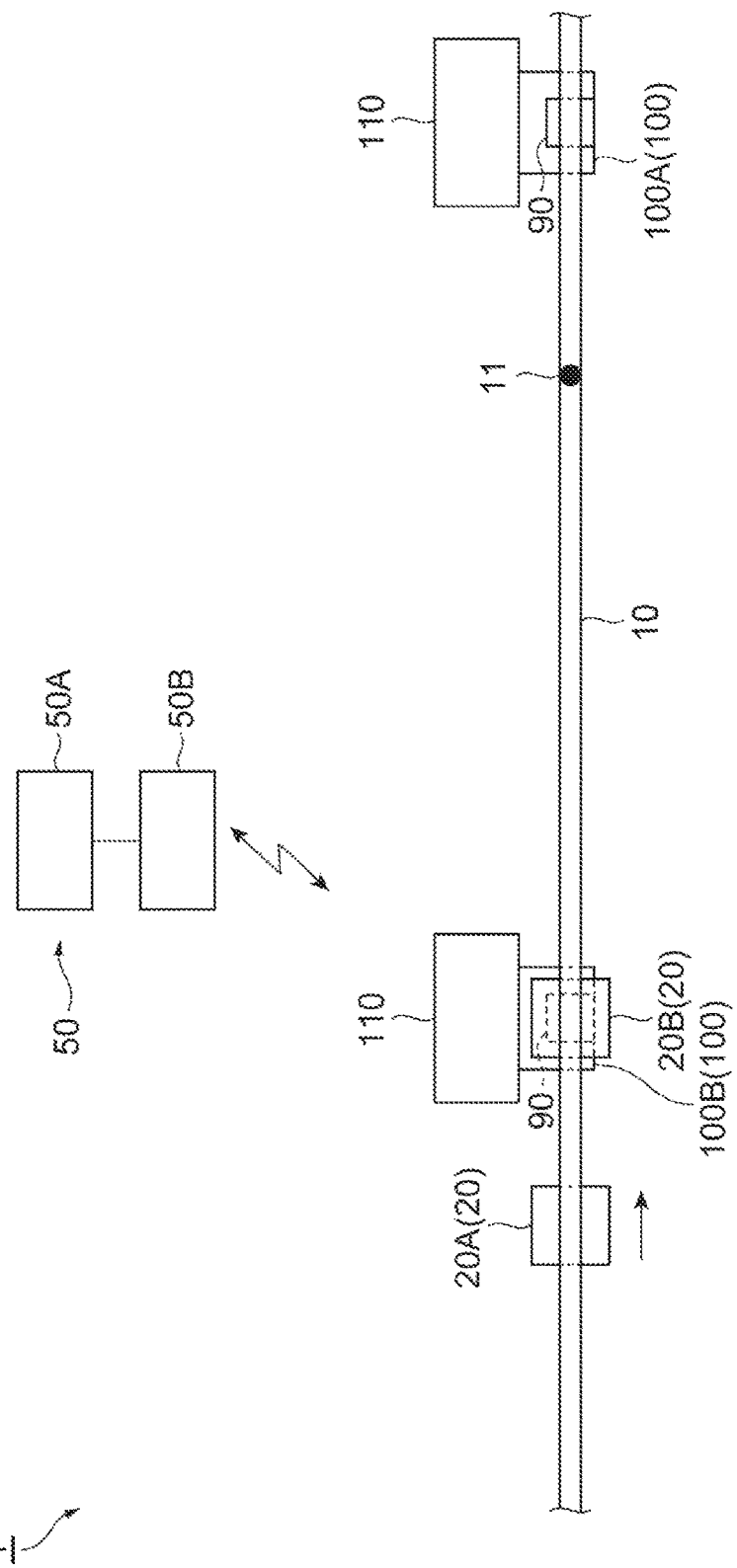
FIG. 2 is a plan view for explaining first transport processing performed in the transport system in FIG. 1.

Subsequently, as illustrated in FIG. 2, the overhead transport vehicle 20B arrives at the station 100B and supplies the FOUP 90 to the station 100B. Accordingly, the overhead transport vehicle 20B changes to a free carriage that is able to receive the transport command. The transport vehicle controller 50B newly detects the overhead transport vehicle 20B as another overhead transport vehicle 20 that is a free carriage (i.e., is capable of receiving the transport command) and that is located less than the first distance from the station 100A, before providing the transport command to the overhead transport vehicle 20A to which the traveling command has been previously provided by the transport vehicle controller 50B. The transport vehicle controller 50B then provides to the overhead transport vehicle 20B, in a duplicate manner as with the overhead transport vehicle 20A, the traveling command to travel to the destination point 11 (the second step).

Figure 3:
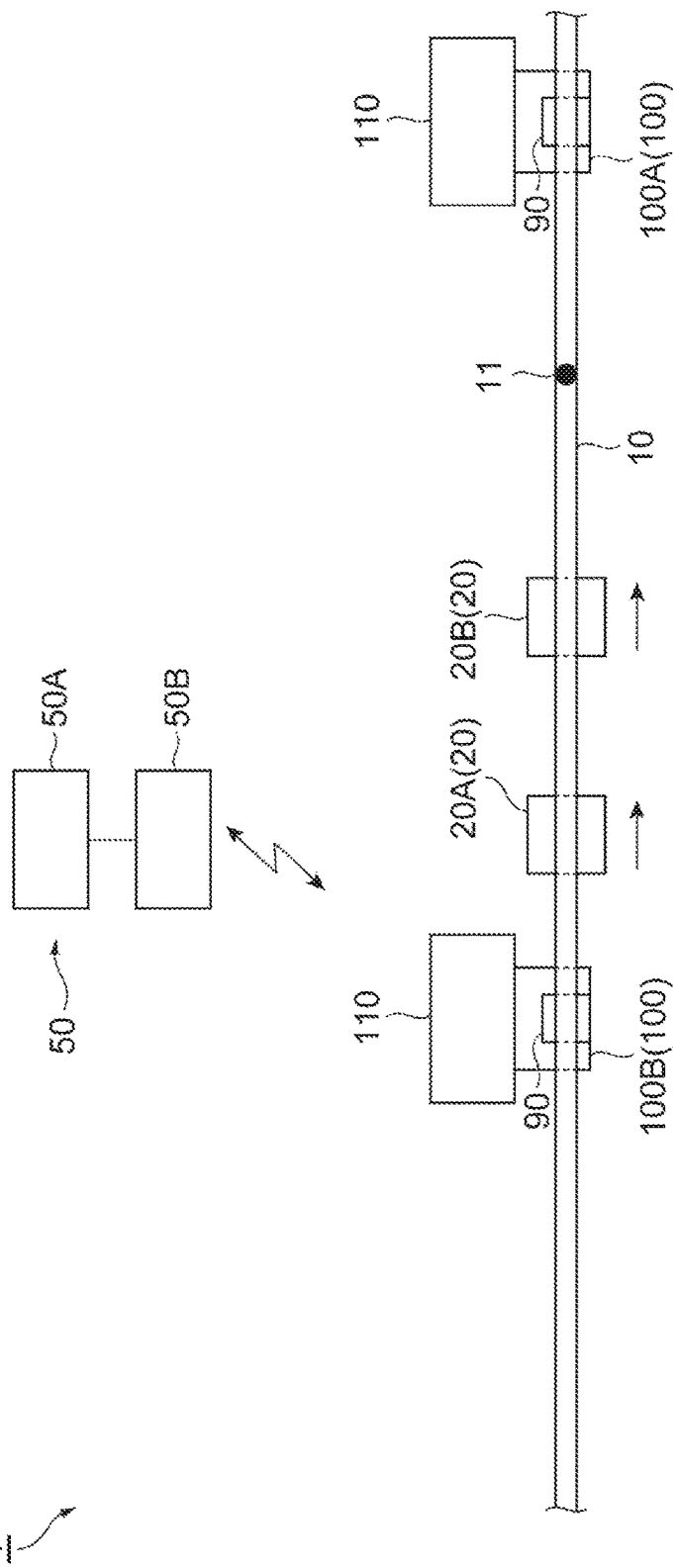
FIG. 3 is a plan view for explaining the first transport processing performed in the transport system in FIG. 1.

Then, as illustrated in FIG. 3, the transport vehicle controller 50B provides the transport command to the overhead transport vehicle 20 (in FIG. 3, the overhead transport vehicle 20B) that is the overhead transport vehicle 20 to which the traveling command has been provided and that first passes through the destination point 11 (the third step).

Specifically, when the overhead transport vehicles 20A and 20B to which the traveling command has been provided reach a just-before-arrival point that is at a second distance from the destination point 11, the overhead transport vehicles 20A and 20B transmit a just-before-arrival report to the transport vehicle controller 50B. In FIG. 3, the overhead transport vehicle 20B transmits the just-before-arrival report to the transport vehicle controller 50B. Then, when the just-before-arrival report is received from the overhead transport vehicle 20B, the transport vehicle controller 50B transmits the transport command to the overhead transport vehicle 20B.

The second distance is a predetermined distance. The area included in the range of the second distance from the destination point 11 is less than the area included in the range of the first distance from the station 100.

Figure 4:
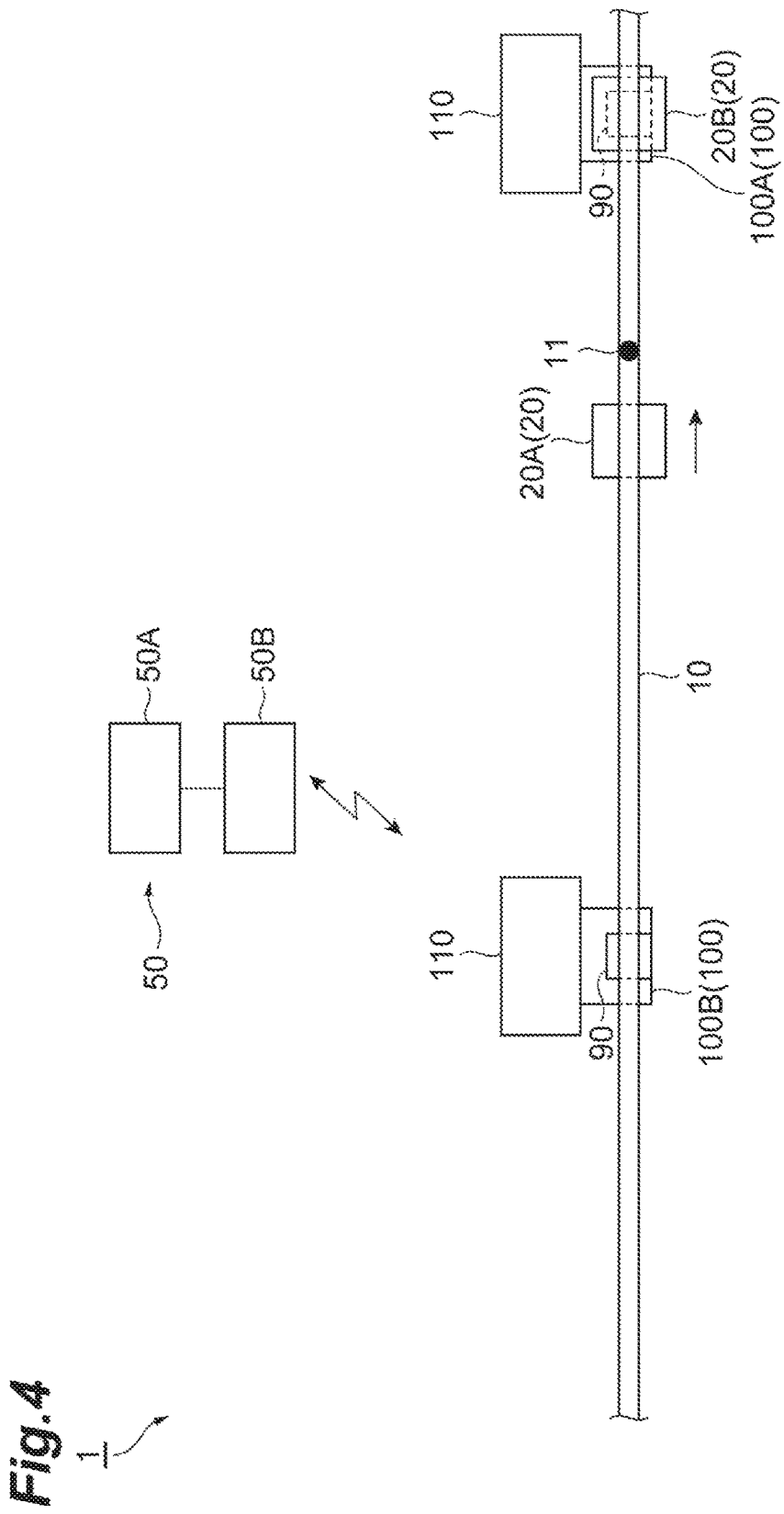
FIG. 4 is a plan view for explaining the first transport processing performed in the transport system in FIG. 1.

Subsequently, as illustrated in FIG. 4, the overhead transport vehicle 20B travels to the area where the FOUP 90 is able to be acquired from the station 100A on the track 10, stops there, and by activating the transfer mechanism, acquires the FOUP 90 from the station 100A. Accordingly, the overhead transport vehicle 20B completes the transport command to acquire the FOUP 90 from the station 100A.

Meanwhile, by traveling to the destination point 11, the overhead transport vehicle 20A completes the traveling command to travel to the destination point 11 and changes to a state in which no command (either a traveling command or a transport command) is provided (that is, becomes a free carriage).

As described above, in the transport system 1 in the first preferred embodiment and the transport method performed in the transport system 1, when the grip-load request to acquire the FOUP 90 from the station 100A is present, the traveling command to travel to the destination point 11 is provided, in a duplicate manner, to a plurality of overhead transport vehicles 20A and 20B that are able to receive the transport command corresponding to the grip-load request and that are located less than the first distance from the station 100A. The destination point 11 is a location on the upstream side of the station 100A and is a point where the overhead transport vehicle 20 that changes to become able to receive the transport command does not newly emerge between the location and the station 100A. Then, the transport command is provided to the overhead transport vehicle 20B that is included in a group of the overhead transport vehicles 20A and 20B to which the traveling command has been provided and that first passes through the destination point 11. Accordingly, it is possible to provide the transport command to the overhead transport vehicle 20B that is more appropriate according to the distance to the station 100A. Thus, it is possible to provide the transport command to the appropriate overhead transport vehicle 20B that first arrives at the station 100A.

In the transport system 1, when the overhead transport vehicles 20A and 20B to which the traveling command has been provided reach the just-before-arrival point located the second distance away from the destination point 11, the overhead transport vehicles 20A and 20B transmit the just-before-arrival report to the transport vehicle controller 50B, and when the just-before-arrival report is received from the overhead transport vehicles 20A and 20B, the transport vehicle controller 50B provides the transport command to the overhead transport vehicles 20A and 20B. Accordingly, it is possible to appropriately provide the transport command to the overhead transport vehicles 20A and 20B.

Second Preferred Embodiment

Figure 5:
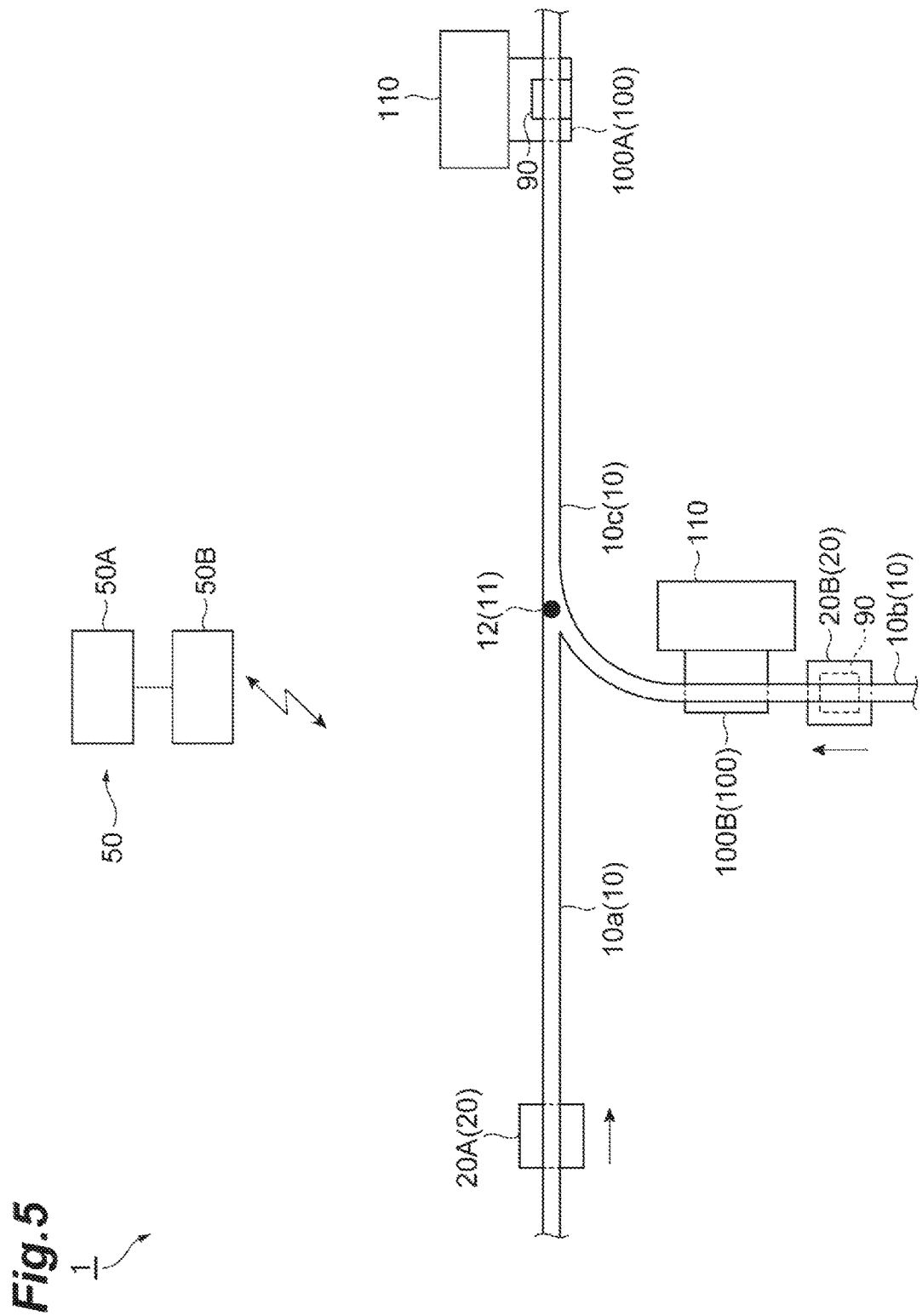
FIG. 5 is a plan view of a part of a transport system according to a second preferred embodiment of the present invention.

The transport system 1 according to a second preferred embodiment of the present invention is different from the transport system 1 of the above-described first preferred embodiment in the configuration of the track 10. That is, the track 10 includes a plurality of sections that merge with or diverge from each other. In FIG. 5, illustrated is a section including a junction in the track 10. The track 10 includes a plurality of sections 10a, 10b, and 10c. The track 10 includes a junction 12 at which the section 10a and the section 10b merge, and on the downstream side of the junction 12, includes the section 10c.

In the transport system 1 of the second preferred embodiment, the destination point 11 is, among junctions of the track 10 on the upstream side of the station 100A, the junction 12 that is the closest to the station 100A. That is, the destination point 11 is the junction 12 at which the section 10a and the section 10b merge.

The section 10a is coupled to the section 10c in a linear manner. The section 10b is coupled to the section 10c while curving from a location in front of the junction 12 that is the destination point 11. The overhead transport vehicle 20 is able to travel from the section 10a, passing through the junction 12, to the section 10c. Furthermore, the overhead transport vehicle 20 is able to travel from the section 10b, passing through the junction 12, to the section 10c.

A plurality of stations 100 are arranged below the track 10. In FIG. 5, the station 100A is arranged below the section 10c and the station 100B is arranged below the section 10b.

In the transport system 1 in the second preferred embodiment, the transport processing described below is performed. As an example, second transport processing performed in the following situation will be described. That is, as illustrated in FIG. 5, the FOUP 90 to be acquired by the overhead transport vehicle 20 is placed on the station 100A arranged below the section 10c.

In such a situation, the transport controller 50A determines that the grip-load request to acquire the FOUP 90 from the station 100A is present.

The transport vehicle controller 50B detects the overhead transport vehicle 20A as the overhead transport vehicle 20 that is able to receive the transport command corresponding to the grip-load request and is located less than the first distance from the station 100A. The transport vehicle controller 50B then provides to the overhead transport vehicle 20A the traveling command to travel to the junction 12 that is the destination point 11 (the first step). In this case, the overhead transport vehicle 20A is traveling along the section 10a. Furthermore, on the upstream side of the station 100B in the section 10b, there is the overhead transport vehicle 20B that is transporting the FOUP 90 to be unloaded to the station 100B.

Figure 6:
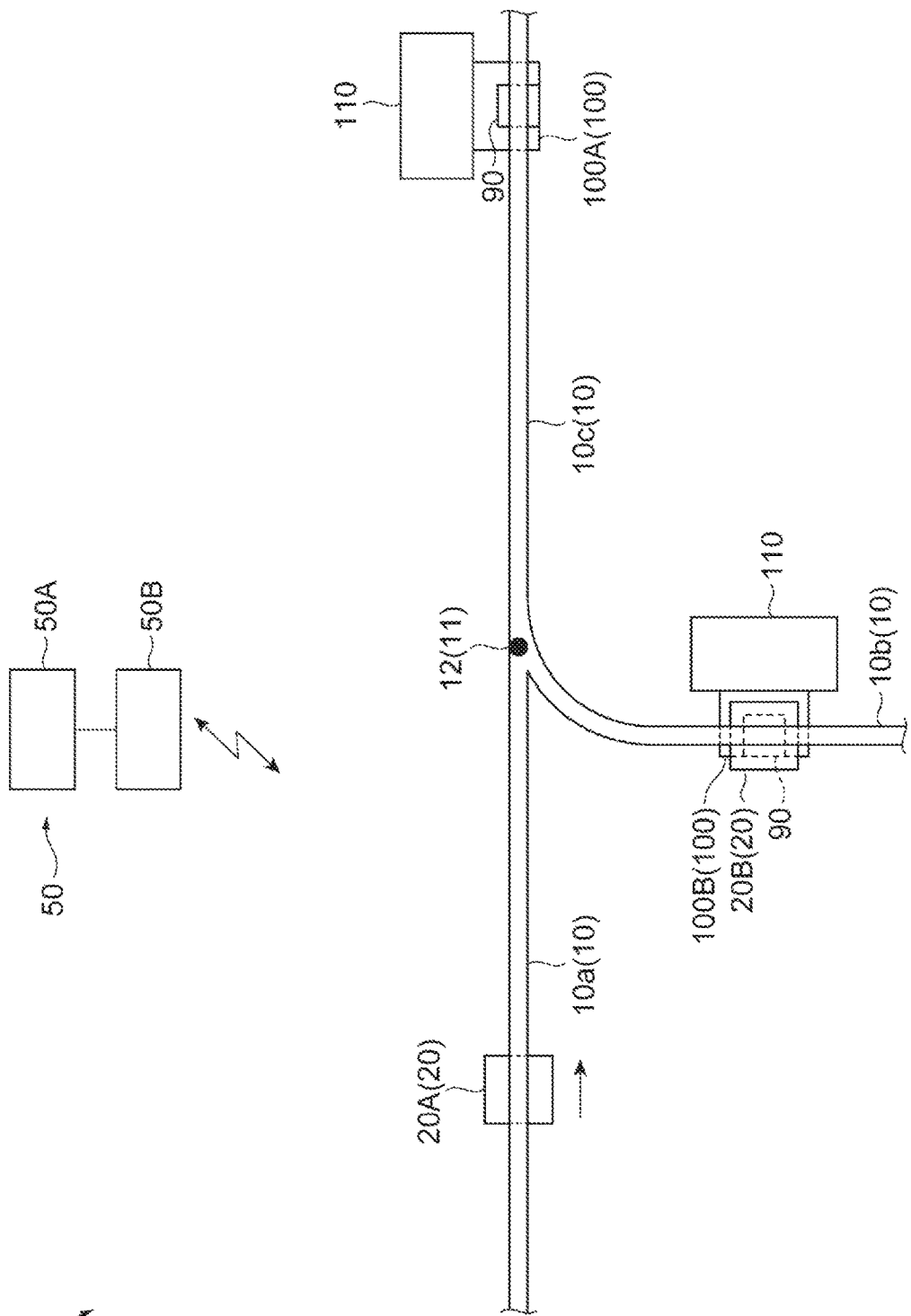
FIG. 6 is a plan view for explaining second transport processing performed in the transport system in FIG. 5.

Subsequently, as illustrated in FIG. 6, the overhead transport vehicle 20B arrives at the station 100B and supplies the FOUP 90 to the station 100B. Accordingly, the overhead transport vehicle 20B changes to be able to receive the transport command, i.e., becomes a free carriage. The transport vehicle controller 50B newly detects the overhead transport vehicle 20B as another overhead transport vehicle 20 that is able to receive the transport command and is located less than the first distance from the station 100A, before providing the transport command to the overhead transport vehicle 20A to which the traveling command has been provided. The transport vehicle controller 50B then provides, in a duplicate manner as with the overhead transport vehicle 20A, the traveling command to travel to the junction 12 to the overhead transport vehicle 20B (the second step).

Figure 7:
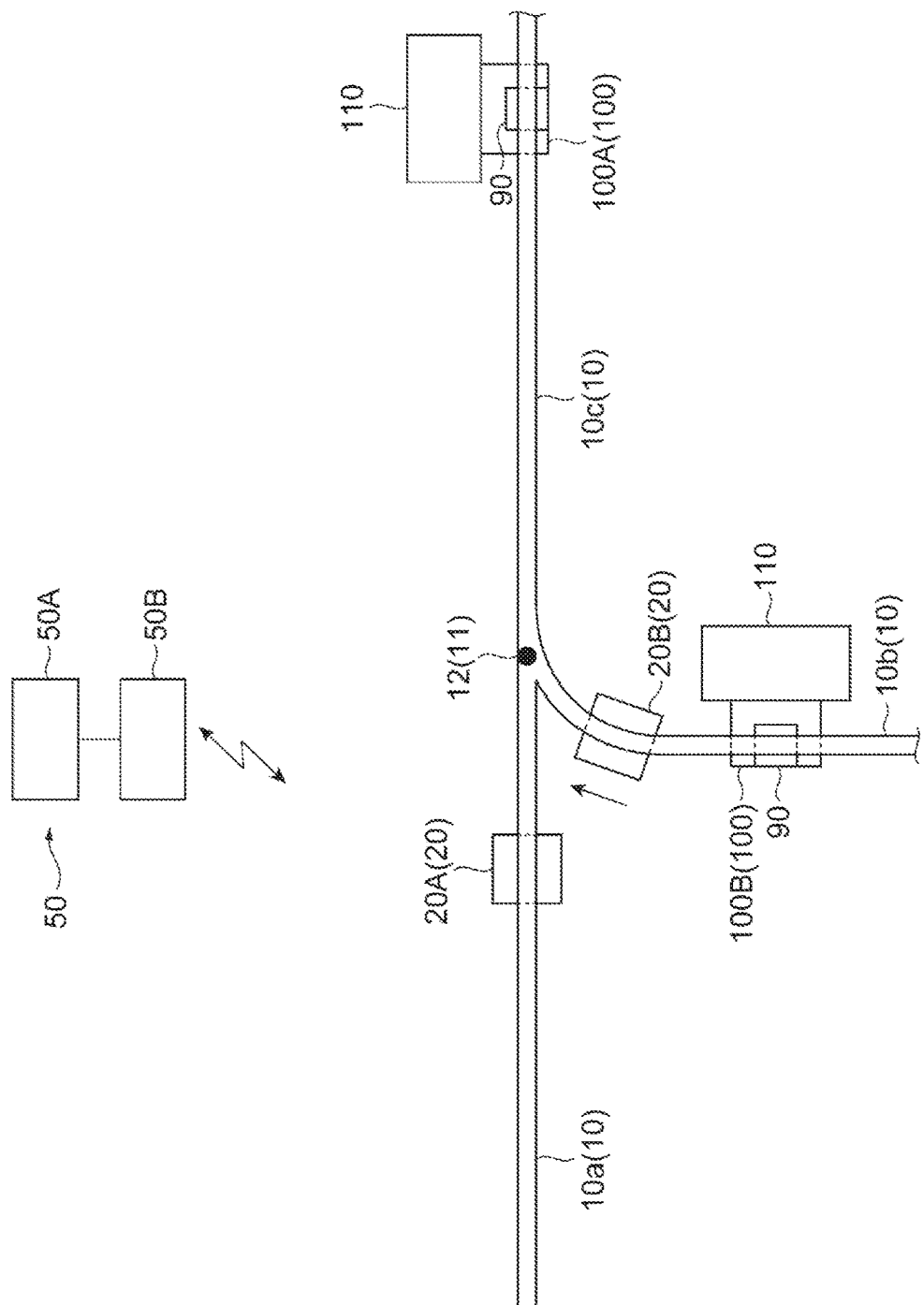
FIG. 7 is a plan view for explaining the second transport processing performed in the transport system in FIG. 5.

Subsequently, as illustrated in FIG. 7, the transport vehicle controller 50B provides the transport command to the overhead transport vehicle 20 (in FIG. 7, the overhead transport vehicle 20B) that is the overhead transport vehicle 20 to which the traveling command has been provided and that first passes through the junction 12 (the third step).

Specifically, when the overhead transport vehicles 20A and 20B to which the traveling command has been provided reach the just-before-arrival point that is at the second distance from the junction 12, the overhead transport vehicles 20A and 20B transmit the just-before-arrival report to the transport vehicle controller 50B. In FIG. 7, the overhead transport vehicle 20B transmits the just-before-arrival report to the transport vehicle controller 50B. Then, when the just-before-arrival report is received from the overhead transport vehicle 20B, the transport vehicle controller 50B provides the transport command to the overhead transport vehicle 20B.

Figure 8:
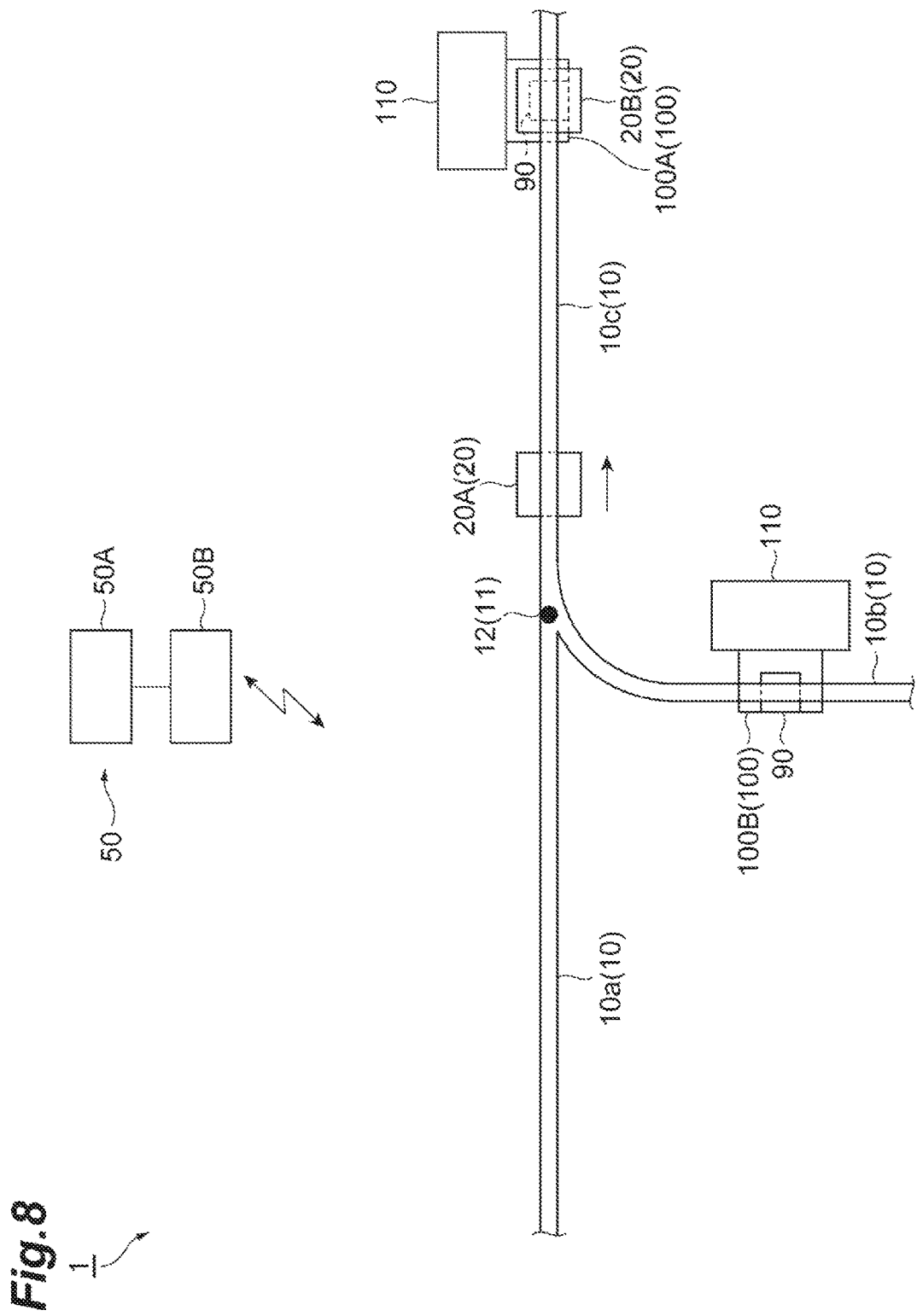
FIG. 8 is a plan view for explaining the second transport processing performed in the transport system in FIG. 5.

Subsequently, as illustrated in FIG. 8, the overhead transport vehicle 20B travels to the area where the FOUP 90 is able to be acquired from the station 100A on the section 10c, stops there, and by activating the transfer mechanism, acquires the FOUP from the station 100A. Accordingly, the overhead transport vehicle 20B completes the transport command to acquire the FOUP 90 from the station 100A.

Meanwhile, by traveling to the junction 12, the overhead transport vehicle 20A completes the traveling command to travel to the junction 12 and changes to a state in which no command is provided (that is, becomes a free carriage).

Figure 9:
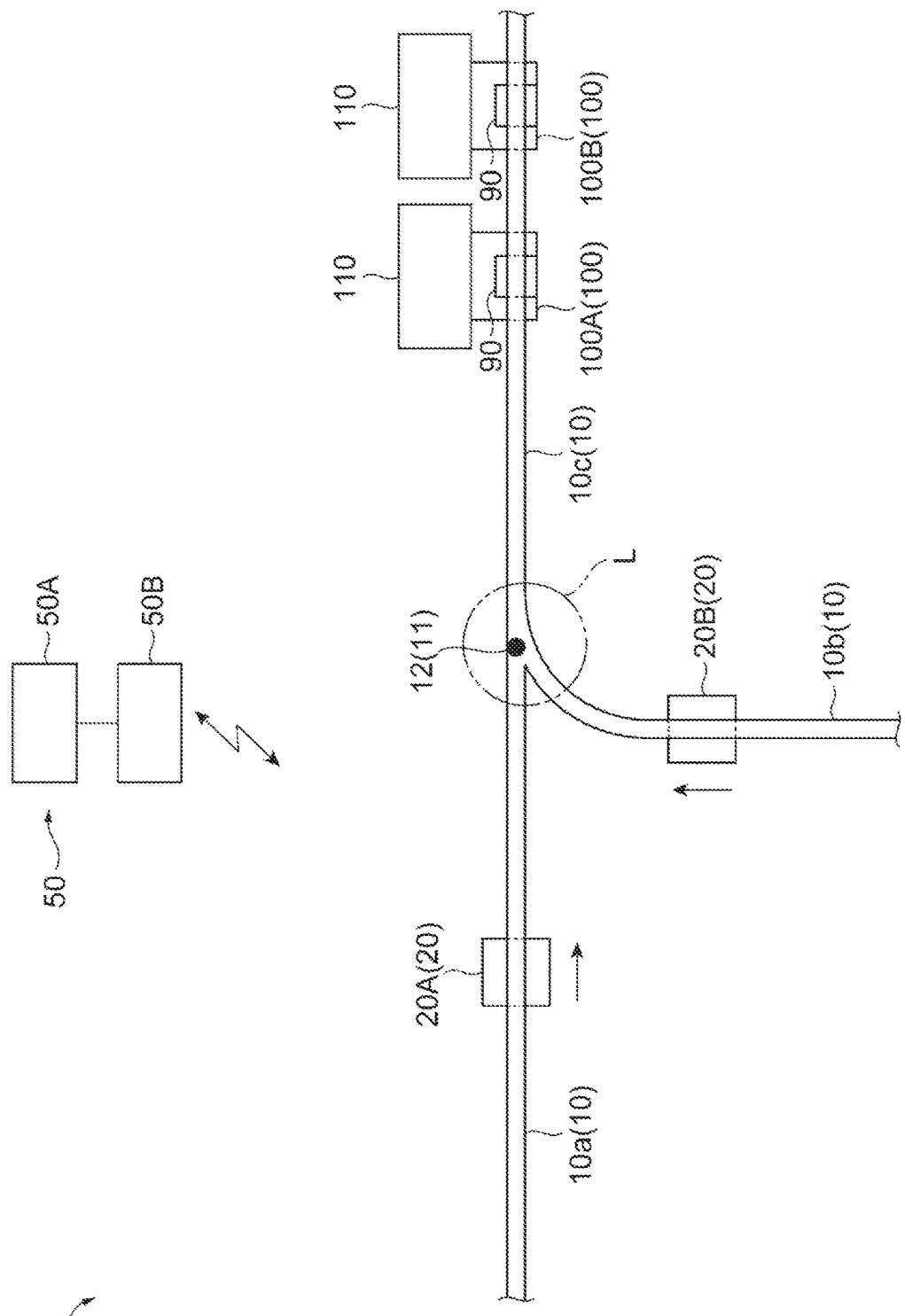
FIG. 9 is a plan view for explaining third transport processing performed in the transport system in FIG. 5.
Figure 10:
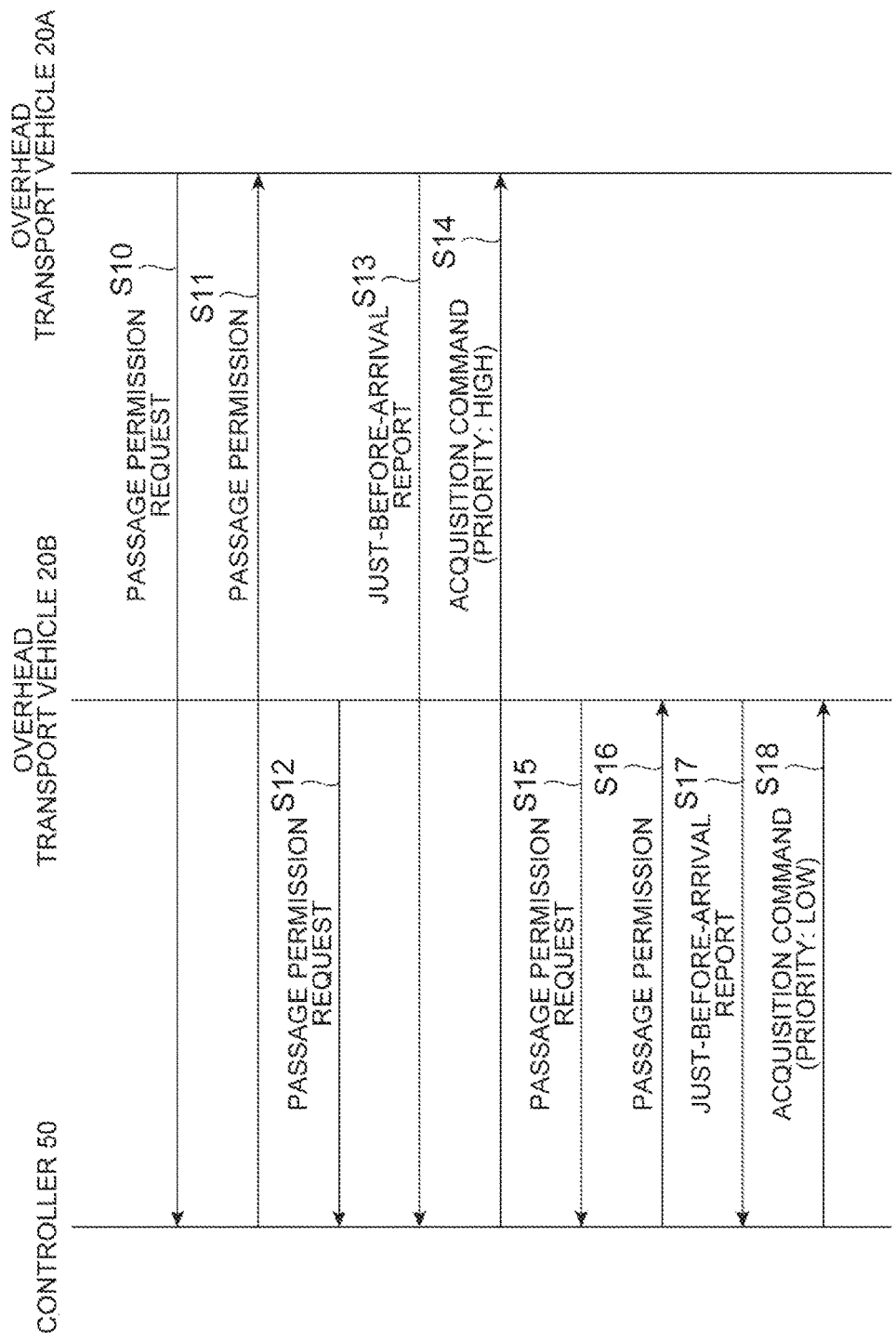
FIG. 10 is a sequence diagram for explaining the third transport processing performed in the transport system in FIG. 5.

Furthermore, in the transport system 1 in the second preferred embodiment, the transport processing described below is performed. As an example, third transport processing performed in the following situation will be described. That is, as illustrated in FIG. 9, in the third transport processing, first intersection control to adjust an order of passing through the junction 12, which is the destination point 11, is performed on the plurality of overhead transport vehicles 20A and 20B traveling along the different sections 10a and 10b. Specifically, "passing through the junction 12" means passing through a lock area L around the junction 12 and through which a plurality of overhead transport vehicles 20 are prohibited from passing at the same time. In this case, there are a plurality of FOUPs 90 for which grip-load requests are present, and priorities are set in advance to these grip-load requests. Then, as illustrated in FIGS. 9 and 10, the FOUP 90 to be acquired by the overhead transport vehicle 20 is placed on each of the stations 100A and 100B arranged below the section 10c.

In such a situation, the transport controller 50A determines that the grip-load request to acquire the FOUP 90 from each of the stations 100A and 100B is present.

The priorities have been set in advance for these grip-load requests of the FOUPs 90 placed on the stations 100A and 100B. In this case, the priority of the grip-load request of the FOUP 90 placed on the station 100A is higher than the priority of the grip-load request of the FOUP 90 placed on the station 100B. That is, the plurality of overhead transport vehicles 20 need to first acquire the FOUP 90 placed on the station 100A and then acquire the FOUP 90 placed on the station 100B afterward.

In the first intersection control, the overhead transport vehicle 20 to which the traveling command has been provided, transmits from the upstream side of the lock area L (that is, on the upstream side of the junction 12) to the transport vehicle controller 50B, a passage permission request to request a permission to pass through the junction 12. In this case, the overhead transport vehicles 20A and 20B transmit the passage permission request to the transport vehicle controller 50B upon reaching a location at which the time required to traveling to the junction 12 that is the destination point 11 is below a certain time.

The location at which the time required for the overhead transport vehicles 20A and 20B to travel to the junction 12 is below a certain time is farther from the junction 12 if the traveling speed of the overhead transport vehicles 20A and 20B is high. Conversely, if the traveling speed of the overhead transport vehicles 20A and 20B is low, the location is closer to the junction 12.

Then, the transport vehicle controller 50B that has received the passage permission requests from the overhead transport vehicles 20A and 20B transmits a passage permission of the junction 12 to the overhead transport vehicles 20A and 20B when the overhead transport vehicles 20A and 20B are able to pass through the junction 12. Specifically, the transport vehicle controller 50B transmits the passage permission of the junction 12 to the overhead transport vehicles 20A and 20B if the transport vehicle controller 50B has not transmitted the passage permission of the junction 12 to the other overhead transport vehicles 20.

Incidentally, the traveling speed of the overhead transport vehicle 20A traveling the section 10a that is coupled to the section 10c in a linear manner is higher than the traveling speed of the overhead transport vehicle 20B traveling the section 10b coupled to the section 10c while curving from a location in front of the junction 12. Thus, at a location at which a distance from the junction 12 is longer than that of the overhead transport vehicle 20B, the overhead transport vehicle 20A may come to a location at which the time required to travel to the junction 12 is below a certain time. In this case, the overhead transport vehicle 20A transmits the passage permission request of the junction 12 to the transport vehicle controller 50B, prior to the overhead transport vehicle 20B, and receives the passage permission of the junction 12 from the transport vehicle controller 50B.

However, because the distance between the overhead transport vehicle 20B and the junction 12 is shorter than the distance between the overhead transport vehicle 20A and the junction 12, the overhead transport vehicle 20B may reach the just-before-arrival point earlier than the overhead transport vehicle 20A. In this case, the overhead transport vehicle 20B transmits the just-before-arrival report to the transport vehicle controller 50B earlier than the overhead transport vehicle 20A and is provided with the transport command responding to the grip-load request of the FOUP 90 placed on the station 100A with a higher priority. As a result, the transport command with a higher priority is provided to the overhead transport vehicle 20B that has not yet received the passage permission of the junction 12. Furthermore, in this case, the transport command with a lower priority is provided to the overhead transport vehicle 20A that has received the passage permission of the junction 12. Consequently, the overhead transport vehicle 20B cannot pass through the junction 12 before the overhead transport vehicle 20A and it is not possible to execute the transport command with a higher priority first.

Meanwhile, in the third transport processing, the overhead transport vehicle 20 transmits the just-before-arrival report to the transport vehicle controller 50B when it has reached the just-before-arrival point and received the passage permission of the junction 12. As illustrated in FIGS. 9 and 10, when the overhead transport vehicle 20A has reached a location at which the time required to travel to the junction 12 is below a certain time, earlier than the overhead transport vehicle 20B, the overhead transport vehicle 20A transmits the passage permission request of the junction 12 to the transport vehicle controller 50B earlier than the overhead transport vehicle 20B (Step S10). In response to this, the transport vehicle controller 50B transmits the passage permission of the junction 12 to the overhead transport vehicle 20A (Step S11).

Subsequently, the overhead transport vehicle 20B reaches a location at which the time required to travel to the junction 12 is below a certain time, and transmits the passage permission request of the junction 12 to the transport vehicle controller 50B (Step S12). However, because the passage permission of the junction 12 has been transmitted to the overhead transport vehicle 20A already, the transport vehicle controller 50B does not transmit the passage permission of the junction 12 to the overhead transport vehicle 20B.

Subsequently, the overhead transport vehicle 20A reaches the just-before-arrival point and transmits the just-before-arrival report to the transport vehicle controller 50B (Step S13). That is, because the overhead transport vehicle 20A has reached the just-before-arrival point and has received the passage permission of the junction 12, the overhead transport vehicle 20A transmits the just-before-arrival report to the transport vehicle controller 50B. In response to this, the transport vehicle controller 50B provides to the overhead transport vehicle 20A the transport command responding to the grip-load request of the FOUP 90 placed on the station 100A with a higher priority (Step S14).

Figure 11:
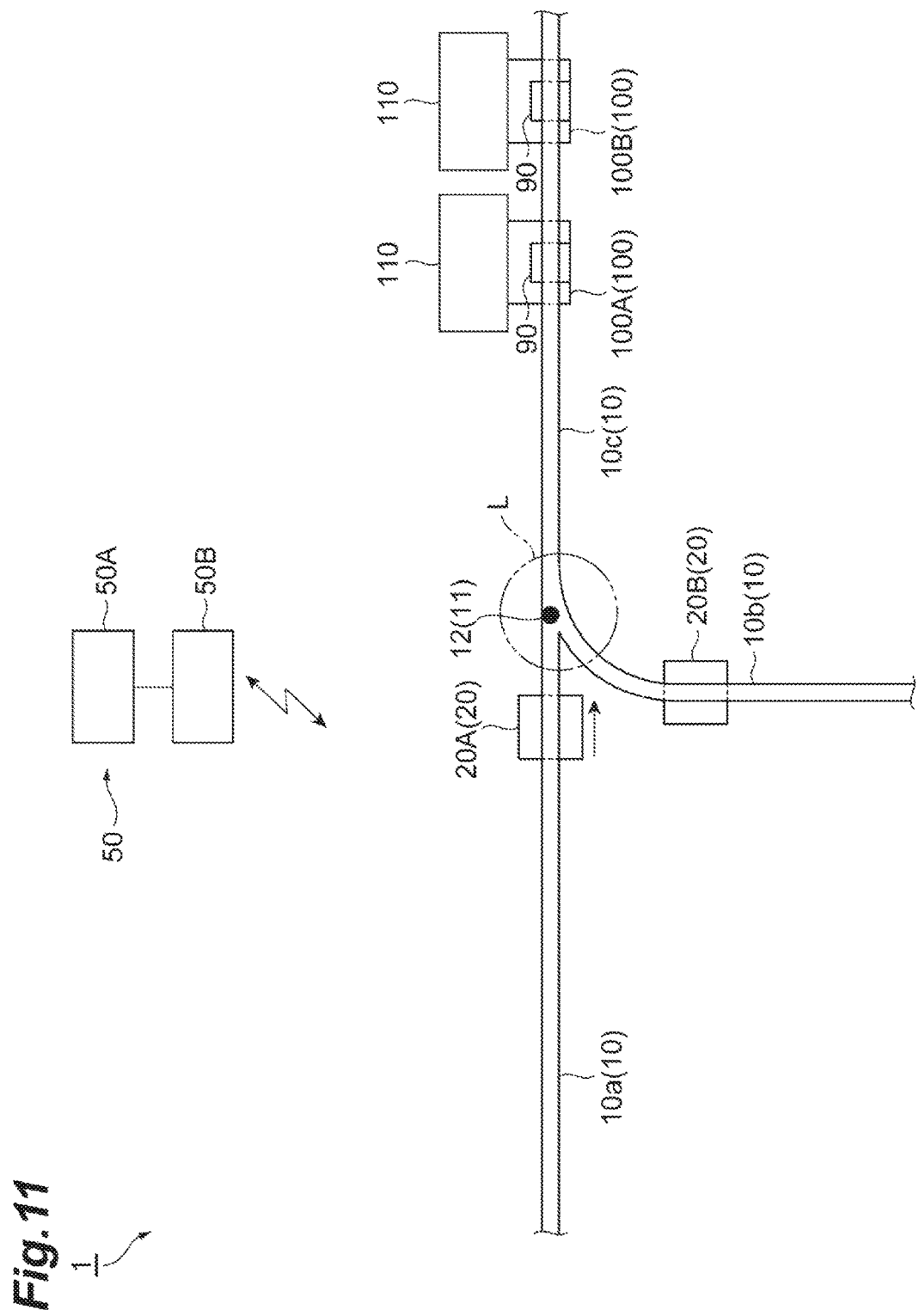
FIG. 11 is a plan view for explaining the third transport processing performed in the transport system in FIG. 5.

Subsequently, as illustrated in FIGS. 10 and 11, the overhead transport vehicle 20A that has received the passage permission of the junction 12 passes through the junction 12 and travels toward the station 100A. Meanwhile, the overhead transport vehicle 20B that has not received the passage permission of the junction 12 waits, without passing through the junction 12, at the upstream side of the junction 12 until the overhead transport vehicle 20A passes through the junction 12.

Subsequently, after the overhead transport vehicle 20A has passed through the junction 12, the overhead transport vehicle 20B transmits the passage permission request of the junction 12 to the transport vehicle controller 50B (Step S15). For example, the overhead transport vehicle 20B may transmit the passage permission request of the junction 12 to the transport vehicle controller 50B after being notified from the transport vehicle controller 50B that the overhead transport vehicle 20A has passed through the junction 12, or the overhead transport vehicle 20B may transmit the passage permission request of the junction 12 to the transport vehicle controller 50B by repeating it at regular intervals. In response to this, the transport vehicle controller 50B transmits the passage permission of the junction 12 to the overhead transport vehicle 20B (Step S16).

Subsequently, the overhead transport vehicle 20B reaches the just-before-arrival point and transmits the just-before-arrival report to the transport vehicle controller 50B (Step S17). That is, because the overhead transport vehicle 20B reached the just-before-arrival point and received the passage permission of the junction 12, the overhead transport vehicle 20B transmits the just-before-arrival report to the transport vehicle controller 50B. In response to this, the transport vehicle controller 50B provides to the overhead transport vehicle 20B the transport command responding to the grip-load request of the FOUP 90 placed on the station 100B with a lower priority (Step S18).

Figure 12:
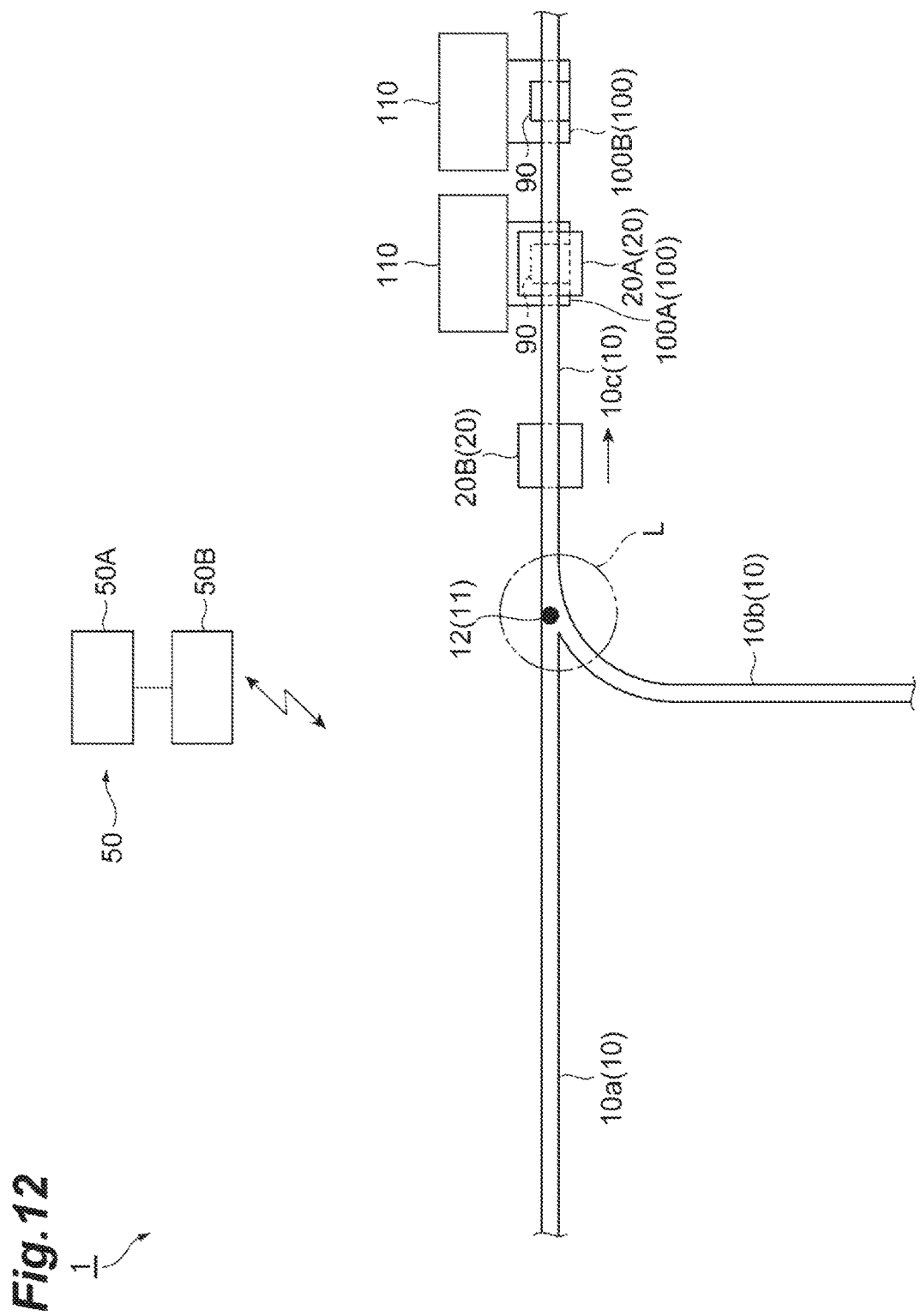
FIG. 12 is a plan view for explaining the third transport processing performed in the transport system in FIG. 5.

Subsequently, as illustrated in FIG. 12, the overhead transport vehicle 20A travels to the area where the FOUP 90 is able to be acquired from the station 100A on the section 10c, stops there, and by activating the transfer mechanism, acquires the FOUP from the station 100A. Thereafter, the overhead transport vehicle 20B travels to the area where the FOUP 90 is able to be acquired from the station 100B on the section 10c, stops there, and by activating the transfer mechanism, acquires the FOUP 90 from the station 100B.

Figure 13:
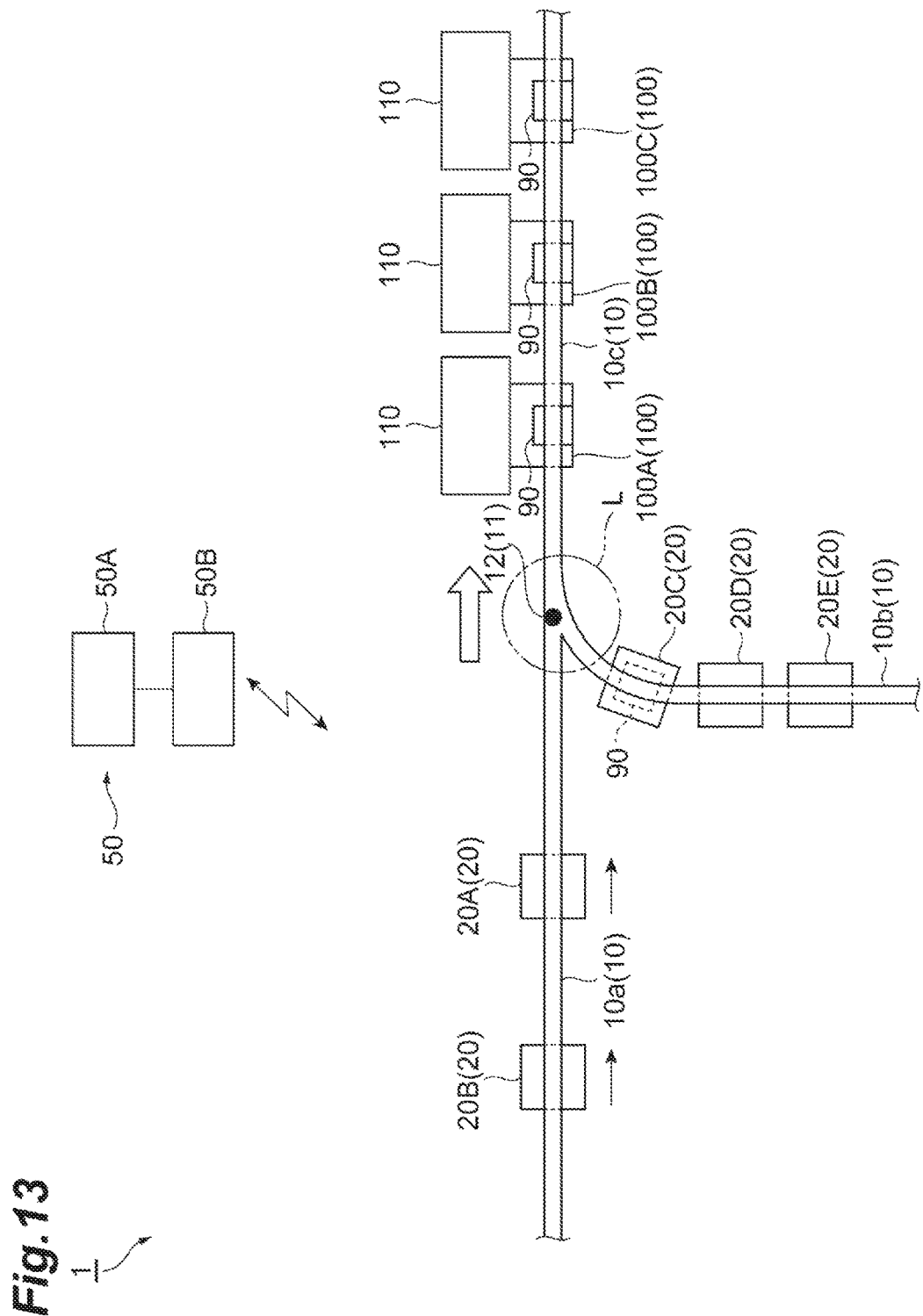
FIG. 13 is a plan view for explaining the third transport processing performed in the transport system in FIG. 5.

In the transport system 1, second intersection control is performed at the junction 12 in which a plurality of overhead transport vehicles 20 traveling along the track in a preferential direction are caused to pass first and the overhead transport vehicles 20 traveling along the track that is not in the preferential direction are caused to pass afterward. In this case, performing the third transport processing has numerous advantageous effects. For example, as illustrated in FIG. 13, a situation in which the FOUP 90 to be acquired by the overhead transport vehicle 20 is placed on each of the stations 100A, 100B, and 100C arranged below the section 10c and in which the priority is set to the grip-load request of each FOUP 90 in advance will be described.

In this case, the overhead transport vehicles 20A and 20B are traveling toward the junction 12 along the section 10a, and the overhead transport vehicles 20C, 20D, and 20E are traveling along the section 10b. At this time, the traveling command is provided to the overhead transport vehicles 20A, 20B, and 20D. Out of the overhead transport vehicles 20A, 20B, and 20D, when the overhead transport vehicle 20D is at a location at which the time required to travel to the junction 12 is below a certain time, the overhead transport vehicle 20D first transmits, from the upstream side of the lock area L, the passage permission request of the junction 12 to the transport vehicle controller 50B.

However, as the second intersection control is performed, the transport vehicle controller 50B causes the overhead transport vehicles 20A and 20B to pass through the junction 12 earlier than the overhead transport vehicle 20D. Accordingly, because the overhead transport vehicle 20D is not able to pass through the junction 12, the transport vehicle controller 50B does not transmit the passage permission of the junction 12 to the overhead transport vehicle 20D even when the passage permission request is received from the overhead transport vehicle 20D. As a result, it is possible to provide the transport command for the grip-load request of the FOUP 90 that is placed on the station 100 with a higher priority to the overhead transport vehicles 20A and 20B that pass through the junction 12 earlier.

As described above, in the transport system 1 in the second preferred embodiment and the transport method performed in the transport system 1, as illustrated in FIG. 5, for example, when the grip-load request to acquire the FOUP 90 from the station 100A is present, the traveling command to travel to the junction 12 that is the destination point 11 is provided, in a duplicate manner, to a plurality of overhead transport vehicles 20A and 20B that are able to receive the transport command corresponding to the grip-load request and are located less than the first distance from the station 100A. The destination point 11 is a location on the upstream side of the station 100A and is a point where the overhead transport vehicle 20 that changes to become able to receive the transport command does not newly emerge between the location and the station 100A. Then, the transport command is provided to the overhead transport vehicle 20B of the plurality of overhead transport vehicles 20A and 20B to which the traveling command has been provided and that first passes through the junction 12. Accordingly, it is possible to provide the transport command to the overhead transport vehicle 20B that is more appropriate according to the distance to the station 100A. By setting the junction 12 as the destination point 11, it is possible to adjust the order of the plurality of overhead transport vehicles 20A and 20B that pass through the junction 12. Thus, it is possible to provide the transport command to the appropriate overhead transport vehicle 20B that first arrives at the station 100A.

In the transport system 1, the destination point 11 is, among the junctions of the track 10 on the upstream side of the station 100A, the junction 12 that is the closest to the station 100A. In this case, because the order of the overhead transport vehicles 20A and 20B is not switched after passing through such a junction 12 and traveling up to the station 100A, it is possible to provide the transport command to the most appropriate overhead transport vehicle 20B.

In the transport system 1, when the overhead transport vehicles 20A and 20B to which the traveling command has been provided reach the just-before-arrival point that is at the second distance from the junction 12, the overhead transport vehicles 20A and 20B transmit the just-before-arrival report to the transport vehicle controller 50B, and when the just-before-arrival report is received from the overhead transport vehicles 20A and 20B, the transport vehicle controller 50B provides the transport command to the overhead transport vehicles 20A and 20B. Accordingly, it is possible to appropriately provide the transport command to the overhead transport vehicles 20A and 20B.

In the transport system 1, the destination point 11 is, among the junctions of the track 10 on the upstream side of the station 100A, the junction 12 that is the closest to the station 100A, and the overhead transport vehicles 20A and 20B to which the traveling command has been provided, transmits from the upstream side of the junction 12, the passage permission request to request a permission to pass through the junction 12 to the transport vehicle controller 50B. The transport vehicle controller 50B that has received the passage permission requests from the overhead transport vehicles 20A and 20B transmits the passage permission of the junction 12 to the overhead transport vehicles 20A and 20B when the overhead transport vehicles 20A and 20B are able to pass through the junction 12. When the overhead transport vehicles 20A and 20B have reached the just-before-arrival point and have received the passage permission, the overhead transport vehicles 20A and 20B transmit the just-before-arrival report to the transport vehicle controller 50B. Accordingly, when the first intersection control or the second intersection control which adjust the order of the plurality of overhead transport vehicles 20A and 20B that pass through the junction 12 is performed, it is possible to provide the transport command with a high priority to the overhead transport vehicle 20 that first passes through the junction 12.

In the transport system 1 of the first preferred embodiment and the second preferred embodiment, the controller 50 may perform deletion processing with respect to the overhead transport vehicles 20, for example.

As an example of the deletion processing, in a case where the transport controller 50A determined that the grip-load request to acquire the FOUP 90 from the station 100A is present, when the overhead transport vehicle 20 that is able to receive the transport command and is closest to the station 100A is detected, the transport vehicle controller 50B provides the traveling command to the overhead transport vehicle 20. As a result, the transport vehicle controller 50B provides the traveling command to the plurality of overhead transport vehicles 20A and 20B.

In such a situation, the transport vehicle controller 50B transmits a delete command to delete the traveling command previously provided to the overhead transport vehicle 20A that is farther from the station 100A than the overhead transport vehicle 20B that is closest to the station 100A, while the traveling command is still provided to the overhead transport vehicle 20B that is the closest to the station 100A.

As described above, in the deletion processing in the transport system 1 in the first preferred embodiment and the second preferred embodiment, when the overhead transport vehicle 20 that is able to receive the transport command and is closest to the station 100A is detected, the transport vehicle controller 50B provides the traveling command to the overhead transport vehicle 20. Then, in a case where the traveling command has been provided to the plurality of overhead transport vehicles 20A and 20B, the transport vehicle controller 50B excludes, from the overhead transport vehicles 20A and 20B, the overhead transport vehicle 20B that is the closest to the station 100A and transmits to the other overhead transport vehicle 20A the delete command to delete the traveling command. Thus, it is possible to reduce or prevent unnecessary traveling of the overhead transport vehicle 20A to which the transport command is not provided.

The exemplary preferred embodiments of the present invention have been explained in the foregoing. The present invention, however, is not limited to the above-described preferred embodiments.

For example, the destination point 11 only needs to be a location on the upstream side of the station 100 and to be a point where the overhead transport vehicle 20 that changes to become able to receive the transport command does not newly emerge between the location and the station 100, and it is not limited to the point exemplified in the above-described preferred embodiments.

In a case where a plurality of grip-load requests are present, when the traveling command is provided to a plurality of overhead transport vehicles 20A and 20B, the number of the overhead transport vehicles being larger than the number of grip-load requests, the transport vehicle controller 50B may exclude, from the overhead transport vehicles 20 to which the traveling command is provided, the overhead transport vehicles 20 that are expected to pass through the destination point 11 early, the number of the excluded overhead transport vehicles 20 being equal to the number of grip-load requests, and the transport vehicle controller 50B may transmit to the other overhead transport vehicles 20 the delete command to delete the traveling command. In this case, it is possible to reduce or prevent unnecessary traveling of the overhead transport vehicle 20 to which the transport command is not provided.

In the above-described preferred embodiments, when the overhead transport vehicles 20 to which the traveling command has been provided reach the just-before-arrival point that is at the second distance from the destination point 11, each of the overhead transport vehicles 20 transmits the just-before-arrival report to the transport vehicle controller 50B, and when the just-before-arrival report is received from the overhead transport vehicle 20, the transport vehicle controller 50B provides the transport command to the overhead transport vehicle 20. However, the overhead transport vehicle 20 may have no need to transmit the just-before-arrival report to the transport vehicle controller 50B. In this case, even when the just-before-arrival report is not received from the overhead transport vehicle 20, the transport vehicle controller 50B may provide the transport command to the relevant overhead transport vehicle 20. For example, the transport vehicle controller 50B may monitor the state of each overhead transport vehicle 20 and, when it is detected that the overhead transport vehicle 20 to which the traveling command has been provided reached the just-before-arrival point, may provide the transport command to the relevant overhead transport vehicle 20.

The transport system 1 has no need to perform all of the first transport processing, the second transport processing, and the third transport processing. That is, the transport system 1 only needs to perform at least one of the first transport processing, the second transport processing, and the third transport processing.

In the above-described preferred embodiments, in a case where the traveling command has been provided to a plurality of overhead transport vehicles 20, the number of the overhead transport vehicles being larger than the number of grip-load requests, the transport vehicle controller 50B may monitor states of the respective overhead transport vehicles 20 and, when the overhead transport vehicle 20 for which the state satisfies a deletion condition is detected, may transmit the delete command to delete the traveling command to the relevant overhead transport vehicle 20. The deletion condition is a condition to determine that the traveling of the overhead transport vehicle 20 is unnecessary, and it is a condition determined based on, for example, the distance from the relevant overhead transport vehicle 20 to the destination point 11 or the travel duration time of the relevant overhead transport vehicle 20. In this case, it is possible to reduce or prevent unnecessary traveling of the overhead transport vehicle 20 to which the transport command is not provided.

In the above-described preferred embodiments, in a case where the traveling command has been provided to only one overhead transport vehicle 20, when the just-before-arrival report is not received from the overhead transport vehicle 20 although the relevant overhead transport vehicle 20 has arrived at the just-before-arrival point, the transport vehicle controller 50B may newly provide the transport command to at least one of the other overhead transport vehicles 20. In this case, even when it is not possible to correctly perform communication between the overhead transport vehicle 20 and the transport vehicle controller 50B, the transport processing is able to be continued.

In the above-described preferred embodiments, the transported object conveyed by the transport system 1 of the present invention is not limited to the FOUP 90 in which a plurality of semiconductor wafers are accommodated, and it may be other containers in which glass wafers, reticles, and the like are accommodated. The transport systems of preferred embodiments of the present invention are not limited to a semiconductor manufacturing plant and are also applicable to other facilities.

In the above-described preferred embodiments, the transport vehicle controller 50B may perform a portion or an entirety of the functions of the transport controller 50A, and the transport controller 50A may perform a portion or an entirety of the functions of the transport vehicle controller 50B.

Alternatively, the single controller 50 may perform the functions of the transport controller 50A and the transport vehicle controller 50B.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system comprising:
    a track;
    a plurality of transport vehicles that travel along the track and convey a transported object to at least a station; and
    a controller configured or programmed to perform communication with and control behavior of respective transport vehicles of the plurality of transport vehicles; wherein
    in a case that a grip-load request to acquire the transported object from the station is present, the controller is configured or programmed to:
    detect that a first transport vehicle of the plurality of transport vehicles is able to receive a transport command corresponding to the grip-load request and is closest to the station, and provide to the first transport vehicle a traveling command to travel to a destination point that is a junction closest to the station among a plurality of junctions on an upstream side of the station;
    before providing the transport command, detect that a second transport vehicle of the plurality of transport vehicles is able to receive the transport command and is closest to the station, and provide the traveling command to the second transport vehicle; and
    provide the transport command to one of the first transport vehicle and the second transport vehicle that first reaches the destination point.

2. The transport system according to claim 1, wherein the controller is configured or programmed to transmit a delete command to one of the first transport vehicle and the second transport vehicle that is not closest to the station to delete the traveling command.

3. The transport system according to claim 1, wherein the controller is configured or programmed to monitor states of the first transport vehicle and the second transport vehicle, and transmit a delete command to one of the first transport vehicle and the second transport vehicle that satisfies a deletion condition to delete the traveling command.

4. The transport system according to claim 1, wherein
    one of the first transport vehicle and the second transport vehicle transmits a just-before-arrival report to the controller upon reaching a just-before-arrival point that is at a second distance from the destination point; and
    the controller provides the transport command to the one of the first transport vehicle and the second transport vehicle that transmitted the just-before-arrival report.

5. The transport system according to claim 4, wherein
    the one of the first transport vehicle and the second transport vehicle to which the traveling command has been provided transmits to the controller, from an upstream side of the destination point, a passage permission request to request a permission to pass through the destination point;
    the controller, upon receiving the passage permission request, transmits a passage permission to the one of the first transport vehicle and the second transport vehicle that transmitted the passage permission request when the one of the first transport vehicle and the second transport vehicle that transmitted the passage permission request is able to pass through the destination point; and
    the one of the first transport vehicle and the second transport vehicle that transmitted the passage permission request transmits the just-before-arrival report to the controller upon reaching the just-before-arrival point.

6. The transport system according to claim 4, wherein, in a case where the traveling command has been provided to only one of the plurality of transport vehicles, the controller provides the transport command to at least one of the plurality of transport vehicles other than the only one of the plurality of transport vehicles when the just-before-arrival report is not received from the only one of the plurality of transport vehicles despite reaching the just-before-arrival point.

7. A transport method executed in a transport system including a track, a plurality of transport vehicles that travel along the track and convey a transported object to at least a station, and a controller configured or programmed to perform communication with and control behavior of respective transport vehicles of the plurality of transport vehicles, the transport method comprising:
    determining that a grip-load request to acquire the transported object from the station is present;
    detecting that a first transport vehicle of the plurality of transport vehicles is able to receive a transport command corresponding to the grip-load request and is closest to the station, and providing to the first transport vehicle a traveling command to travel to a destination point that is a junction closest to the station among a plurality of junctions on an upstream side of the station;
    before providing the transport command, detecting that a second transport vehicle of the plurality of transport vehicles is able to receive the transport command and is closest to the station, and providing the traveling command to the second transport vehicle; and providing the transport command to one of the first transport vehicle and the second transport vehicle that first reaches the destination point.

8. The transport method according to claim 7, further comprising transmitting a delete command to one of the first transport vehicle and the second transport vehicle that is not closest to the station to delete the traveling command.

9. The transport method according to claim 7, further comprising monitoring states of the first transport vehicle and the second transport vehicle, and transmitting a delete command to one of the first transport vehicle and the second transport vehicle that satisfies a deletion condition to delete the traveling command.

10. The transport method according to claim 7, wherein
one of the first transport vehicle and the second transport vehicle transmits a just-before-arrival report to the controller upon reaching a just-before-arrival point that is at a second distance from the destination point; and
the controller provides the transport command to the one of the first transport vehicle and the second transport vehicle that transmitted the just-before-arrival report.

11. The transport method according to claim 10, wherein
the one of the first transport vehicle and the second transport vehicle to which the traveling command has been provided transmits to the controller, from an upstream side of the destination point, a passage permission request to request a permission to pass through the destination point;
the controller, upon receiving the passage permission request, transmits a passage permission to the one of the first transport vehicle and the second transport vehicle that transmitted the passage permission request when the one of the first transport vehicle and the second transport vehicle that transmitted the passage permission request is able to pass through the destination point; and
the one of the first transport vehicle and the second transport vehicle that transmitted the passage permission request transmits the just-before-arrival report to the controller upon reaching the just-before-arrival point.

12. The transport method according to claim 10, wherein, in a case where the traveling command has been provided to only one of the plurality of transport vehicles, the controller provides the transport command to at least one of the plurality of transport vehicles other than the only one of the plurality of transport vehicles when the just-before-arrival report is not received from the only one of the plurality of transport vehicles despite reaching the just-before-arrival point.

* * * * *